(12) United States Patent
Asayama

(10) Patent No.: US 7,825,471 B2
(45) Date of Patent: Nov. 2, 2010

(54) SEMICONDUCTOR MEMORY DEVICE INCLUDING SRAM CELL HAVING WELL POWER POTENTIAL SUPPLY REGION PROVIDED THEREIN

(75) Inventor: Shinobu Asayama, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 117 days.

(21) Appl. No.: 12/219,588

(22) Filed: Jul. 24, 2008

(65) Prior Publication Data

US 2009/0067219 A1    Mar. 12, 2009

(30) Foreign Application Priority Data

Sep. 12, 2007   (JP) .............................. 2007-236431

(51) Int. Cl.
*H01L 27/01*   (2006.01)

(52) U.S. Cl. ................... 257/350; 257/530; 257/510; 257/408; 257/392; 257/365; 257/903

(58) Field of Classification Search ................... 257/350, 257/530, 510, 903, 408, 392, 365
See application file for complete search history.

(56) References Cited

U.S. PATENT DOCUMENTS

| 6,856,031 | B1 | 2/2005 | Nguyen et al. |
| 6,885,609 | B2 | 4/2005 | Lee et al. |
| 7,239,538 | B2 | 7/2007 | Asayama et al. |
| 2004/0120209 | A1 | 6/2004 | Lee et al. |
| 2006/0171192 | A1 | 8/2006 | Asayama et al. |
| 2007/0090485 | A1* | 4/2007 | Takao .......................... 257/510 |

FOREIGN PATENT DOCUMENTS

| JP | 2004-200702 | 7/2004 |
| JP | 2005-236282 | 9/2005 |
| JP | 2006-210736 | 8/2006 |

* cited by examiner

*Primary Examiner*—Long Pham
(74) *Attorney, Agent, or Firm*—McGinn IP Law Group, PLLC

(57) ABSTRACT

A semiconductor memory device includes a first well region of a first conductivity type, first and second SRAM cells adjacently arranged to each other, the first and second SRAM cells each including at least a first transfer transistor and a drive transistor formed on the first well, the first transfer transistor and the drive transistor being coupled in series between a bit line and a power source line, and a first diffusion region of the first conductivity type arranged between the drive transistor of the first SRAM cell and the drive transistor of the second SRAM cell, to apply a first well potential to the first well.

3 Claims, 7 Drawing Sheets

Fig. 4

| X | X | X | X | X | X | X | X |
|---|---|---|---|---|---|---|---|
| X | X | X | X | X | X | X | X |
| X | X | X | X | X | X | X | X |
| X | X | X | X | X | X | X | X |
| X | X | X | X | X | X | X | X |
| X | X | X | X | X | X | X | X |
| X | X | X | X | X | X | X | X |
| X | X | X | X | X | X | X | X |

Fig. 7

| Y | Y | Y | Y | Y | Y | Y | Y |
|---|---|---|---|---|---|---|---|
| X | X | X | X | X | X | X | X |
| X | X | X | X | X | X | X | X |
| X | X | X | X | X | X | X | X |
| X | X | X | X | X | X | X | X |
| Y | Y | Y | Y | Y | Y | Y | Y |
| X | X | X | X | X | X | X | X |
| X | X | X | X | X | X | X | X |
| X | X | X | X | X | X | X | X |
| X | X | X | X | X | X | X | X |
| Y | Y | Y | Y | Y | Y | Y | Y |

US 7,825,471 B2

SEMICONDUCTOR MEMORY DEVICE INCLUDING SRAM CELL HAVING WELL POWER POTENTIAL SUPPLY REGION PROVIDED THEREIN

BACKGROUND OF THE INVENTION

1. Field of the Invention

The present invention relates to a semiconductor memory device and more particularly to a semiconductor memory device that includes plural SRAM cells.

2. Description of Related Art

An SRAM (Static Random Access Memory) is used as a semiconductor memory device. The SRAM can be formed in a standard semiconductor CMOS process, and is widely used in a system LSI and the like. A memory cell of the SRAM includes an N-well region, a drive transistor formed on a P-well region, a load transistor, and a transfer transistor. In this case, it is necessary to supply a well potential to each of the N-well region and the P-well region.

Techniques disclosed in Patent Documents 1 and 2 discloses a semiconductor memory device where a well potential supply region used to supply a well potential is provided in each unit SRAM cell.

Meanwhile, Patent Document 3 discloses a semiconductor memory device including plural unit SRAM cells, each of which includes eight transistors. FIG. 1 is a circuit diagram showing an SRAM cell 100 disclosed in Patent Document 3.

The SRAM cell 100 includes NMOS drive transistors N13 and N31, load transistors P11 and P21, first transfer transistors N11 and N22, second NMOS transfer transistors N12 and N21, word lines WLX and WLY, and bit lines BIT and /BIT. The drive transistor N13 and the load transistor P11 are connected in series between a power source potential VDD and a ground potential VSS. Further, the drive transistor N31 and the load transistor P21 are connected in series between the power source potential VDD and the ground potential. Furthermore, the first and second transfer transistors N11 and N12, which are connected in series, are connected between the bit line BIT and a node ND that is formed between the drive transistor N13 and the load transistor P11. The first and second transfer transistors N22 and N21, which are connected in series, are connected between the bit line /BIT and a node /ND that is formed between the drive transistor N31 and the load transistor P21. Further, gates of the first transfer transistors N11 and N22 are connected to the word line WLY, and gates of the second transfer transistors N12 and N21 are connected to the word line WLX.

FIG. 5 is a view showing the layout of a semiconductor memory device including SRAM cells 100 shown in FIG. 1. Meanwhile, the semiconductor memory device shown in FIG. 5 has a layout where plural SRAM cells disclosed in Patent Document 3 is provided. Further, FIG. 6 are cross-sectional views of the SRAM cell 100 shown in FIG. 5 taken along the C-C' and D-D' lines, respectively. In the SRAM memory cell 100, a P-well region Pwell1, a P-well region Pwell2, and an N-well region Nwell are formed on the semiconductor substrate (P-type substrate). As shown in FIG. 5 and FIG. 6, the drive transistor N13 is formed in the P-well region Pwell1 by N-type diffusion layers DN3 and DN4 and polysilicon wiring PL1, and the drive transistor N31 is formed in the P-well region Pwell2 by N-type diffusion layers DN5 and DN6 and polysilicon wiring PL2. The load transistor P11 is formed in the N-well region Nwell by P-type diffusion layers DP1 and DP2 and the polysilicon wiring PL1, and the load transistor P21 is formed in the N-well region Nwell by P-type diffusion layers DP3 and DP4 and the polysilicon wiring PL2. Further, the first transfer transistor N11 is formed in the P-well region Pwell1 by N-type diffusion layers DN1 and DN2 and polysilicon wiring PL3, and the second transfer transistor N12 is formed in the P-well region Pwell1 by the N-type diffusion layers DN2 and DN3 and polysilicon wiring PL4. The second transfer transistor N21 is formed in the P-well region Pwell2 by N-type diffusion layers DN6 and DN7 and polysilicon wiring PL5, and the first transfer transistor N22 is formed in the P-well region Pwell2 by N-type diffusion layers DN7 and DN8 and polysilicon wiring PL6.

[Patent Document 1] Japanese Patent Laid Open Application No. 2004-200702

[Patent Document 2] Japanese Patent Laid Open Application No. 2005-236282

[Patent Document 3] Japanese Patent Laid Open Application No. 2006-210736

SUMMARY OF THE INVENTION

FIG. 7 is a schematic view showing the disposition of a cell array where the SRAM cells 100 formed using the layout shown in FIG. 5 are efficiently apposed. Meanwhile, in FIG. 7, X indicates a unit SRAM cell (SRAM cell 100), and Y indicates a well potential supply cell that is used to supply a well potential to a unit SRAM cell. As shown in FIG. 7, dedicated well potential supply cells Y need to be provided at regular intervals in order to supply a well potential to the unit SRAM cell X.

However, since well potential supply cells Y are arranged at regular intervals in the semiconductor memory device disclosed in Patent Document 3, it is not possible to uniformly and regularly arrange memory cells in the memory cell formation region. For this reason, deviation of transistors is increased in the semiconductor memory device disclosed in Patent Document 3. Further, in the semiconductor memory device disclosed in Patent Document 3, an area of the cell array is increased depending on the increase of the number of arranged well potential supply cells.

As described above, it was difficult to improve the regularity and area efficiency of the cell array in the semiconductor memory device in the related art.

According to an exemplary aspect of the invention, a semiconductor memory device includes a first well region of a first conductivity type, at least first and second SRAM cells adjacently arranged to each other, the first and second SRAM cells each including at least a first transfer transistor and a drive transistor formed on the first well region, the first transfer transistor and the drive transistor being coupled in series between a bit line and a power source line, and a first diffusion region of the first conductivity type arranged between the drive transistor of the first SRAM cell and the drive transistor of the second SRAM cell to apply a first well potential to the first well.

According to the semiconductor memory device of the exemplary aspect of the invention, the first diffusion region used to supply a first well potential may be formed in the first well region in the SRAM cell.

According to the invention, it is possible to provide a semiconductor memory device that can improve the regularity and area efficiency of a cell array.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 4 is a schematic view showing the disposition of a cell array where the SRAM cells 100 according to the first exemplary embodiment are arranged;

FIG. 7 is a schematic view showing the disposition of a cell array where well potential supply cells and the SRAM cells 100 disclosed in Patent Document 3 are arranged.

DETAILED DESCRIPTION OF THE EXEMPLARY EMBODIMENTS

Figure 1:
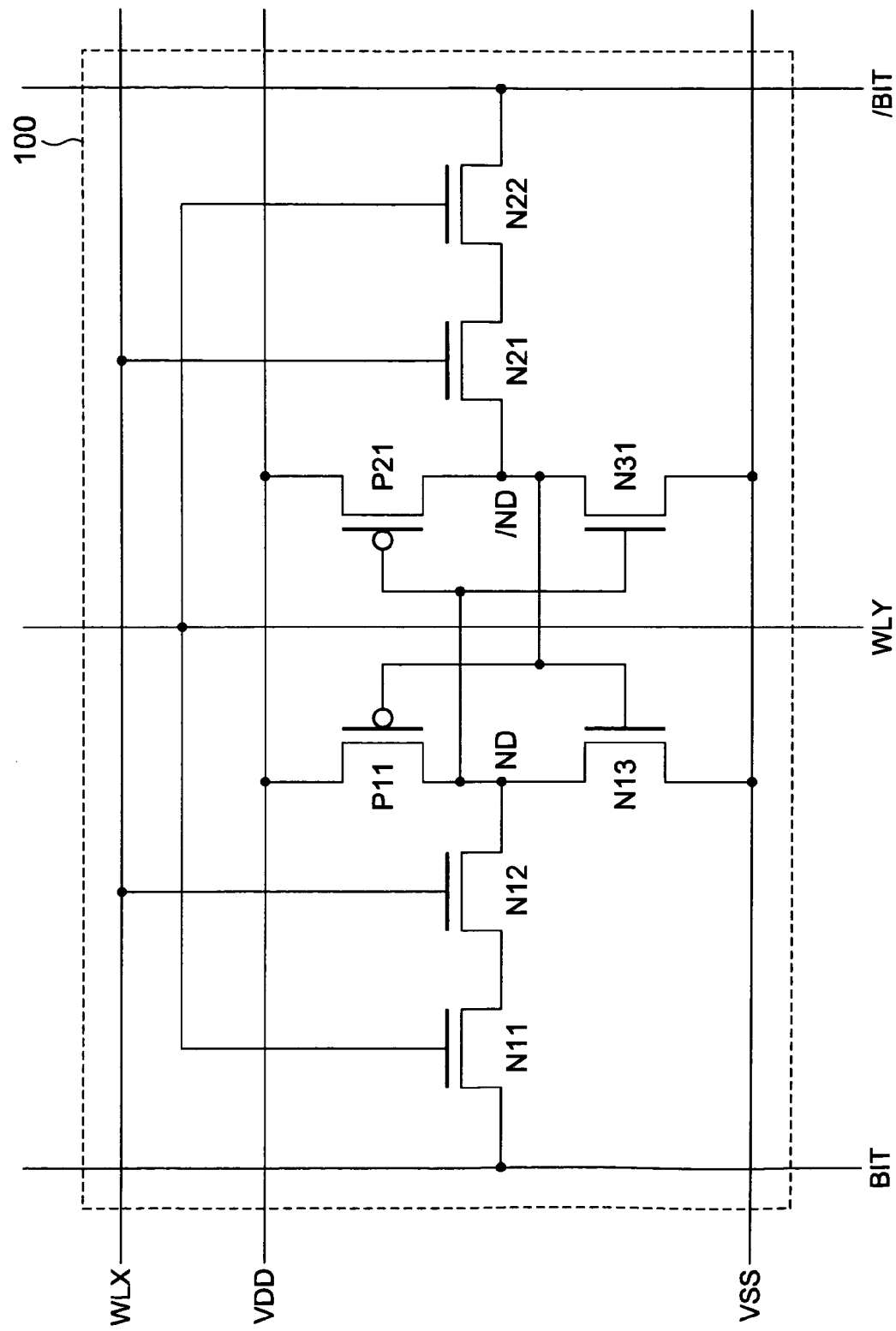
FIG. 1 is a circuit diagram showing an SRAM cell in a semiconductor memory device according to a first exemplary embodiment.

FIG. 1 is a circuit diagram showing an SRAM cell in a semiconductor memory device according to a first exemplary embodiment of the invention. The semiconductor memory device is an SRAM (Static Random Access Memory), and includes plural unit SRAM cells that are each composed of eight transistors shown in FIG. 1. That is, the SRAM according to this embodiment is an eight-transistor SRAM having low power consumption.

As shown in FIG. 1, the SRAM cell 100 includes a first drive transistor (hereinafter, referred to as a drive transistor N13), a second drive transistor (hereinafter, referred to as a drive transistor N31), a first load transistor (hereinafter, referred to as a load transistor P11), a second load transistor (hereinafter, referred to as a load transistor P21), a first transfer transistor (hereinafter, referred to as a transfer transistor N11), a second transfer transistor (hereinafter, referred to as a transfer transistor N22), a third transfer transistor (hereinafter, referred to as a transfer transistor N12), a fourth transfer transistor (hereinafter, referred to as a transfer transistor N21), word lines WLX and WLY, and bit lines BIT and /BIT. Each of the drive transistors N13 and N31 and the transfer transistors N11, N22, N12, and N21 is an NMOS transistor, and each of the load transistors P11 and P21 is a PMOS transistor. Further, a first inverter includes the drive transistor N13 and the load transistor P11, and a second inverter includes the drive transistor N31 and the load transistor P21.

A source of the load transistor P11 is connected to a power source potential VDD, and a drain thereof is connected to a drain of the drive transistor N13. Further, a source of the drive transistor N13 is connected to a ground potential VSS. A source of the load transistor P21 is connected to the power source potential VDD, and a drain thereof is connected to a drain of the drive transistor N31. Further, a source of the drive transistor N31 is connected to the ground potential VSS.

An input terminal (a node between a gate of the load transistor P11 and a gate of the drive transistor N13) of the first inverter is connected to an output terminal (a node /ND between the load transistor P21 and the drive transistor N31) of the second inverter. Further, an input terminal (a node between a gate of the load transistor P21 and a gate of the drive transistor N31) of the second inverter is connected to an output terminal (a node ND between the load transistor P11 and the drive transistor N13) of the first inverter.

A source of the transfer transistor N11 is connected to the bit line BIT, and a drain thereof is connected to a source of the transfer transistor N12. Further, a drain of the transfer transistor N12 is connected to the node ND between the load transistor P11 and the drive transistor N13. A source of the transfer transistor N22 is connected to the bit line /BIT, and a drain thereof is connected to a source of the transfer transistor N21. Further, a drain of the transfer transistor N21 is connected to the node /ND between the load transistor P21 and the drive transistor N31. The gates of the transfer transistors N11 and N22 are connected to the word line WLY, and the gates of the transfer transistors N12 and N21 are connected to the word line WLX.

The operation of the SRAM cell 100 will be described. First, a read-out operation will be described. The bit lines BIT and /BIT are precharged to be in an "H" level state. In this state, the word lines WLX and WLY are at an "H" level. Accordingly, the transfer transistors N11 and N22 and the transfer transistors N12 and N21 are in an ON state. Then, the bit line BIT is discharged. Accordingly, it is possible to read out data stored in the SRAM cell 100.

Next, a writing operation will be described. Data is written so that a potential of the node ND is at an "H" level and a potential of the node /ND is at an "L" level. First, one (bit line BIT) of the precharged bit lines BIT and /BIT is at the "H" level, and the other (bit line BIT) thereof is at the "L" level. In the state, the word lines WLX and WLY are at the "H" level. Accordingly, the transfer transistors N11 and N22 and the transfer transistors N12 and N21 are in the ON state. Therefore, the nodes ND and /ND are in the "H" level and the "L" level, respectively. As a result, it is possible to write data on the SRAM cell 100.

Figure 2:
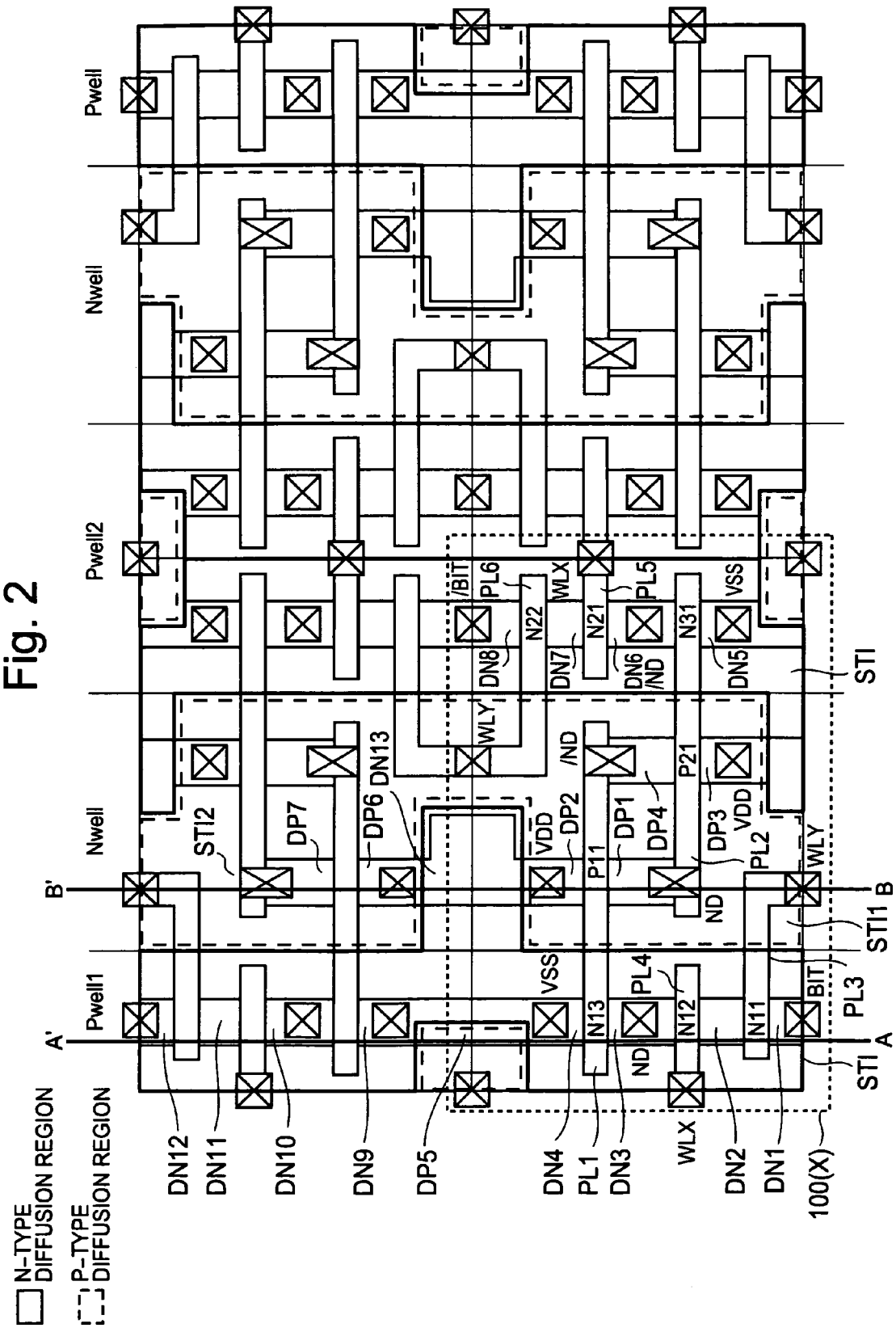
FIG. 2 is a view showing the layout of the semiconductor memory device including SRAM cells 100 according to the first exemplary embodiment.

The structure and operation of the SRAM memory cell 100 have been described above. Next, the layout of the SRAM memory cell 100 will be described. FIG. 2 is a view showing an exemplary layout of the semiconductor memory device including the SRAM cells 100 shown in FIG. 1. The SRAM cell 100 according to this embodiment includes polysilicon wiring PL1 to PL6 and plural contacts CT on the surface of the substrate. The polysilicon wiring is gate wiring that is formed on a semiconductor substrate with a gate insulation layer interposed therebetween. Further, the plural contacts CT are contacts that are electrically connected to metal wiring, such as diffusion layers of the semiconductor substrate, gate electrodes, word lines, and bit lines.

In the SRAM memory cell 100, a first P-type well region (hereinafter, referred to as a P-well region Pwell1), a second P-type well region (hereinafter, referred to as a P-well region Pwell2), and an N-type well region Nwell are formed on the semiconductor substrate (P-type substrate). The N-well region Nwell is formed between the P-well region Pwell1 and the P-well region Pwell2. Further, in the SRAM memory cell 100, N-type diffusion layers DN1 to DN4 are formed on the P-well region Pwell1. P-type diffusion layers DP1 to DP4 are formed on the N-well region Nwell. N-type diffusion layers DN5 to DN8 are formed on the P-well region Pwell2.

Further, a first P well potential supply region (hereinafter, referred to as a P-type diffusion layer DP5) is formed between the N-type diffusion layer DN4 and an N-type diffusion layer DN9 of the unit SRAM cell adjacent to the SRAM cell 100. An N-type well potential supply region (hereinafter, referred to as an N-type diffusion layer DN13) is formed between the P-type diffusion layer DP2 and a P-type diffusion layer DP6 of the unit SRAM cell adjacent to the SRAM cell 100. Further, an N-type well potential supply region is formed between the P-type diffusion layer DP3 and an N-type diffusion layer (not shown) of the unit SRAM cell (not shown) adjacent to the SRAM cell 100. A second P well potential supply region is formed between the N-type diffusion layer DN5 and an N-type diffusion layer (not shown) of a unit SRAM cell (not shown) adjacent the SRAM cell 100.

The drive transistor N13 includes the N-type diffusion layers DN3 and DN4 and the polysilicon wiring PL1, and the drive transistor N31 includes the N-type diffusion layers DN5 and DN6 and the polysilicon wiring PL2. The load transistor P11 includes the P-type diffusion layers DP1 and DP2 and the polysilicon wiring PL1, and the load transistor P21 includes the P-type diffusion layers DP3 and DP4 and the polysilicon wiring PL2.

The transfer transistor N11 includes the N-type diffusion layers DN1 and DN2 and the polysilicon wiring PL3, and the transfer transistor N12 includes the N-type diffusion layers DN2 and DN3 and the polysilicon wiring PL4. The transfer transistor N21 includes the N-type diffusion layers DN6 and DN7 and the polysilicon wiring PL5, and the transfer transistor N22 includes the N-type diffusion layers DN7 and DN8 and the polysilicon wiring PL6.

In this case, the polysilicon wiring PL1 is formed to extend from the P-well region Pwell1 to the N-well region Nwell. The polysilicon wiring PL1 is the gate electrodes of the drive transistor N13 and the load transistor P11, which are formed to extend from the upper side of the N-type diffusion layers DN3 and DN4 to the P-type diffusion layers DP1 and DP2. Further, the polysilicon wiring PL2 is formed to extend from the N-well region Nwell to the P-well region Pwell2. The polysilicon wiring PL2 is the gate electrodes of the load transistor P21 and the drive transistor N31, which are formed to extend from the upper side of the P-type diffusion layers DP3 and DP4 to the N-type diffusion layers DN5 and DN6.

The N-type diffusion layer DN1 (the drain of the NMOS transistor N11) and the N-type diffusion layer DN8 (the drain of the NMOS transistor N22) are connected to the bit lines BIT and /BIT by the contacts CT, respectively. The N-type diffusion layer DN4 (the source of the NMOS transistor N13) and the N-type diffusion layer DN5 (the source of the NMOS transistor N31) are connected to the ground potential VSS by the contacts CT, respectively. The P-type diffusion layer DP2 (the source of the PMOS transistor P11) and the P-type diffusion layer DP3 (the source of the PMOS transistor P21) are connected to the power source potential VDD by the contacts CT, respectively.

The polysilicon wiring PL4 (the gate of the NMOS transistor N12) and PL5 (the gate of the NMOS transistor N21) are connected to the word line WLX by the contacts CT, respectively. Further, the polysilicon wiring PL3 (the gate of the NMOS transistor N11) and PL6 (the gate of the NMOS transistor N22) are connected to the word line WLY by the contacts CT, respectively.

The N-type diffusion layer DN3 (the drain of the NMOS transistor N13) is connected to the node ND by the contact CT. The N-type diffusion layer DN6 (the drain of the NMOS transistor N31) is connected to the node /ND by the contact CT.

In this way, first and second P-type well potential supply regions, which are used to supply first and second P well potentials to the P-well region Pwell1 and the P-well region Pwell2, respectively, are formed in the P-well region Pwell1 and the P-well region Pwell2 of the unit SRAM cell 100. Further, the N-type well potential supply region, which is used to supply an N well potential to the N-well region Nwell, is formed in the N-well region Nwell. Furthermore, the first and second P well potential supply regions are disposed to be symmetrical with respect to the center of the memory cell, and N well potential supply regions are disposed to be symmetrical with respect to the center of the memory cell. The first P well potential supply region and the N well potential supply region will be described in detail herein with reference to FIG. 3.

Figure 3A:
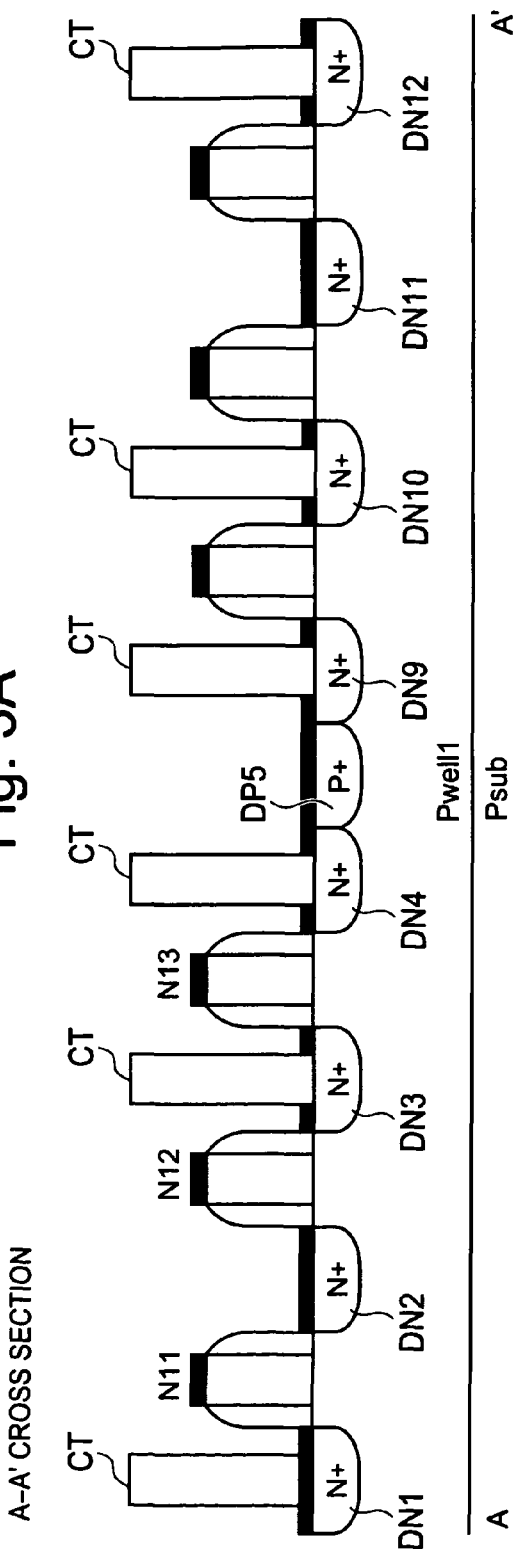
FIGS. 3A and 3B are cross-sectional views of the layout of the semiconductor memory device according to the first exemplary embodiment.

FIG. 3A is a cross-sectional view of an exemplary layout of the SRAM cells 100 shown in FIG. 2 taken along the A-A' line. As described above, the P-well region Pwell1 is formed on the P-type substrate. The N-type diffusion layers DN1 to DN4 and DN9 to DN12 are formed in the P-well region Pwell1. Meanwhile, DN9 to DN12 indicate N-type diffusion layers formed in the P-well region Pwell1 of the SRAM cell adjacent to the SRAM cell 100. In this case, the P-type diffusion layer DP5, which is the first P-type well potential supply region used to supply a P well potential to the P-well region Pwell1, is formed between the N-type diffusion layers DN4 and DN9. The P-type diffusion layer DP5 has butting diffusion structure that is formed between the N-type diffusion layers DN4 and DN9 so as to come in contact with the N-type diffusion layers. For this reason, the P-type diffusion layer DP5 can supply, for example, a ground potential VSS, which is supplied to the N-type diffusion layer DN4 through the contact CT formed on the N-type diffusion layer DN4, to the P-well region Pwell1. Therefore, if the P-type diffusion layer has the butting diffusion structure, contacts do not need to be formed on the P-type diffusion layer DP5.

Figure 3B:
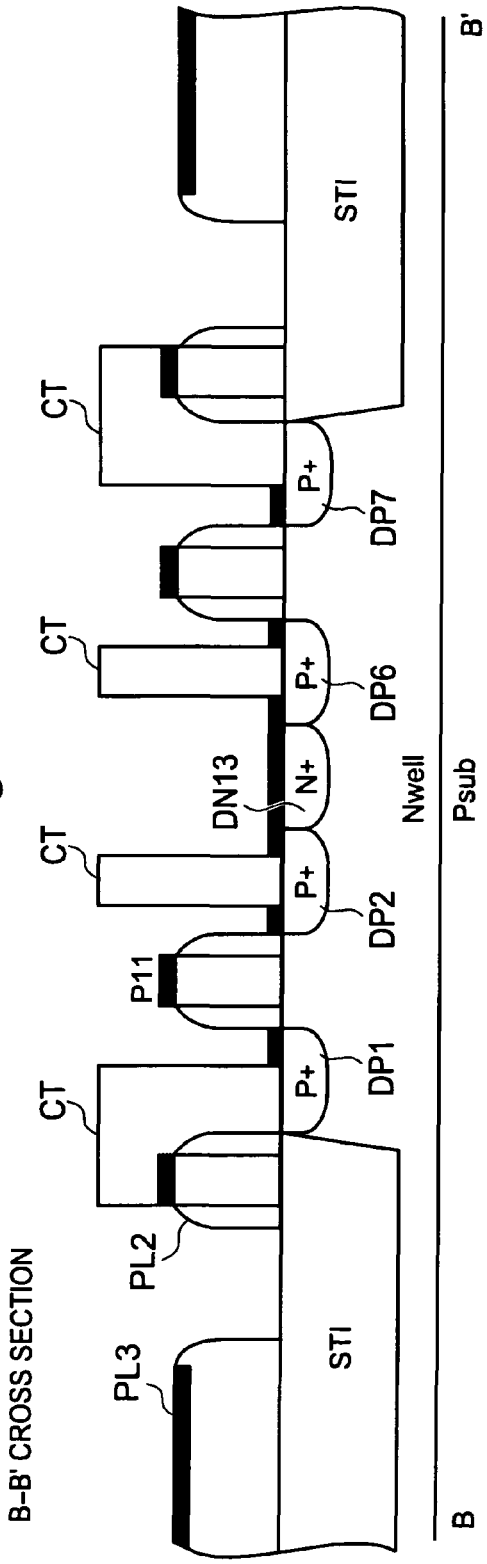
Figure 5:
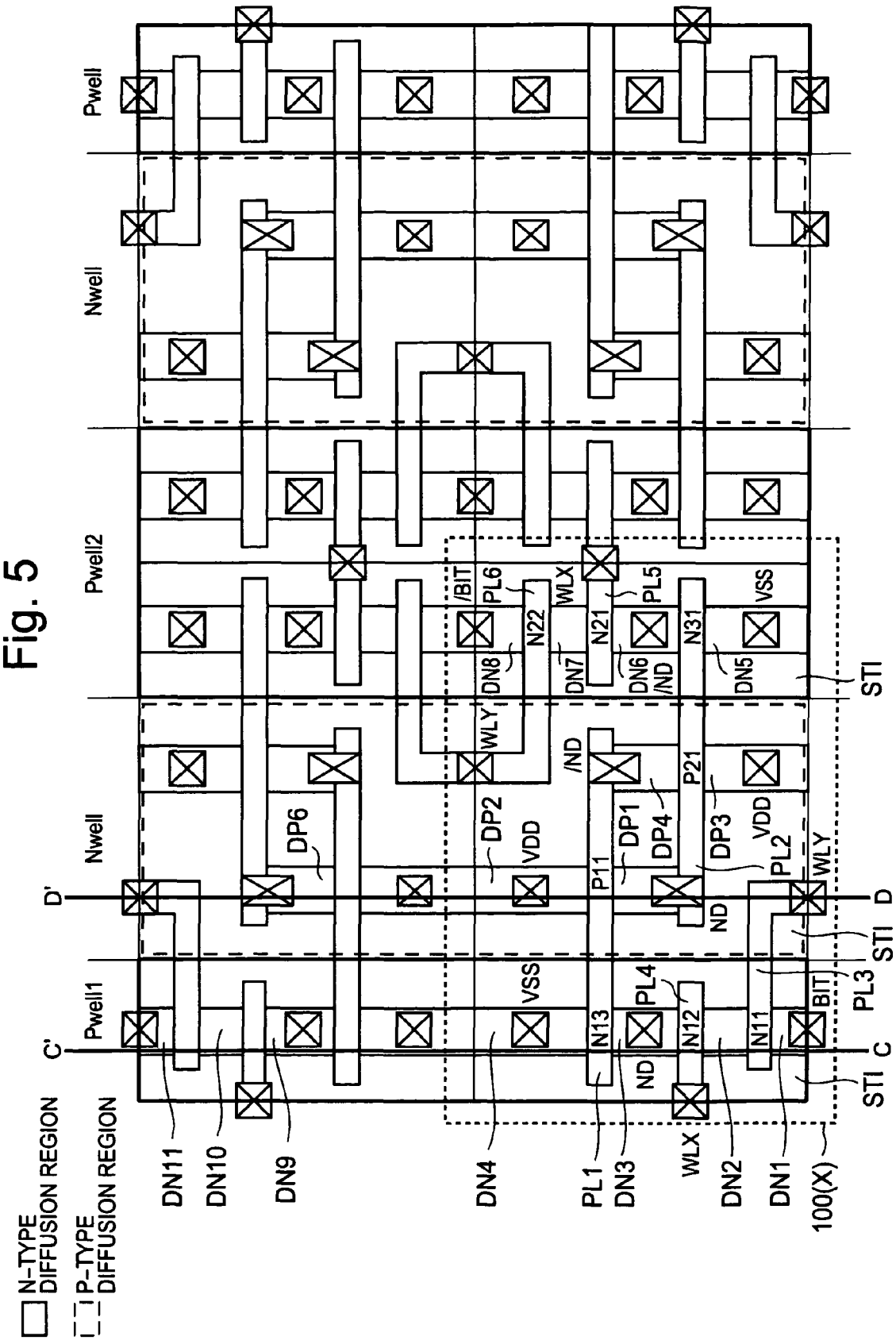
FIG. 5 is a view showing the layout of a semiconductor memory device including SRAM cells 100 disclosed in Patent Document 3.
Figure 6:
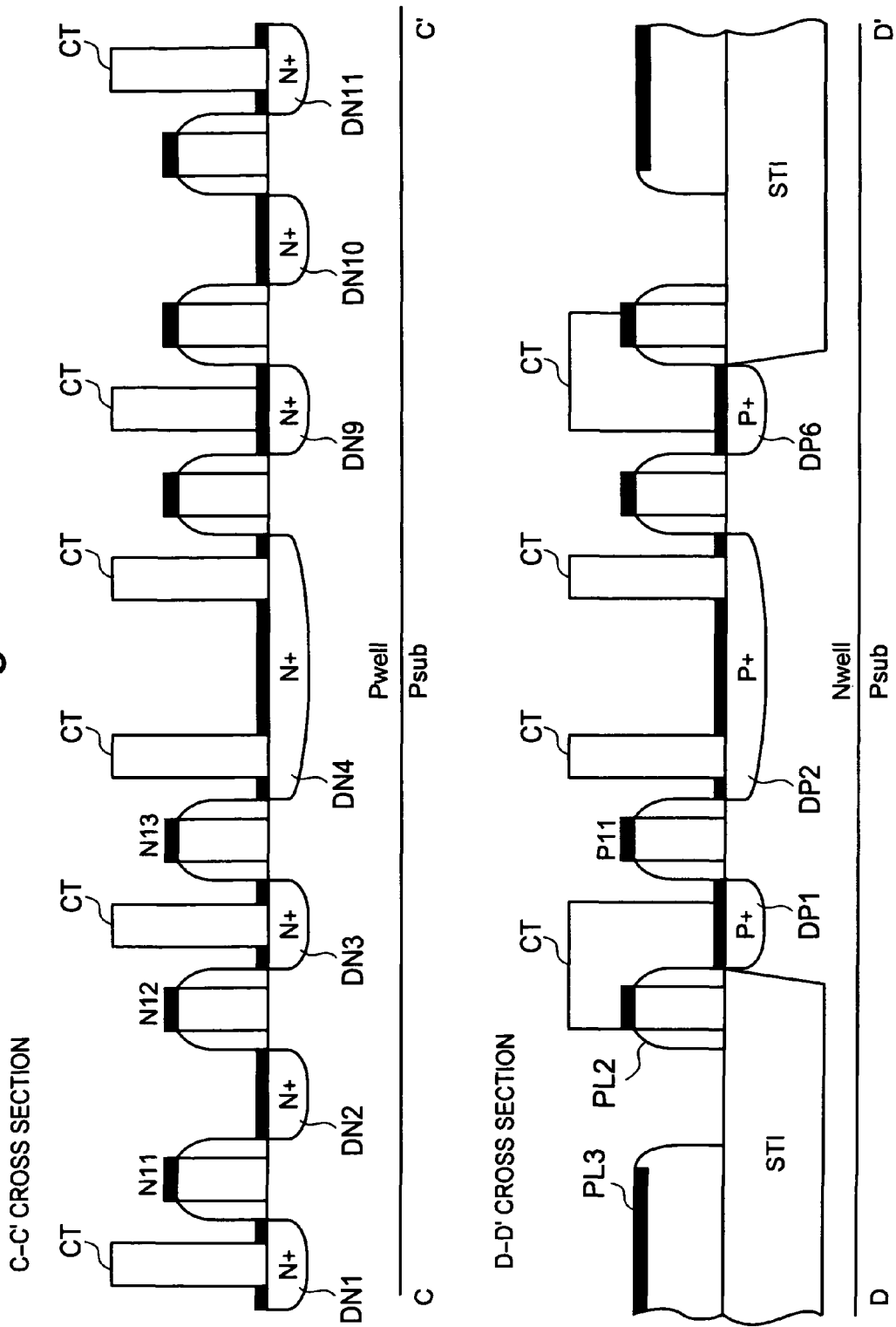
FIG. 6 is a cross-sectional view of the layout of the semiconductor memory device disclosed in Patent Document 3.

FIG. 3B is a cross-sectional view of an exemplary layout of the SRAM cells 100 shown in FIG. 2 taken along the B-B' line. As described above, the N-well region Nwell1 is formed on the P-type substrate. The P-type diffusion layers DP1, DP2, DP6, DP7, and STI (Shallow Trench Isolation) regions 1 and 2 are formed in the N-well region Pwell1. Meanwhile, DP6 and DP7 indicate P-type diffusion layers formed in the N-well region Nwell1 of the SRAM cell adjacent to the SRAM cell 100. In this case, the N-type diffusion layer DN13, which is the N-type well potential supply region used to supply an N well potential to the N-well region Pwell1, is formed between the P-type diffusion layers DP2 and DP6. The N-type diffusion layer DN13 has butting diffusion structure that is formed between the P-type diffusion layers DP2 and DP6 so as to come in contact with the P-type diffusion layers. For this reason, the N-type diffusion layer DN13 can supply, for example, a power source potential VDD, which is supplied to the P-type diffusion layer DP2 through the contact CT formed on the P-type diffusion layer DP2, to the N-well region Nwell1. Therefore, if the N-type diffusion layer has the butting diffusion structure, contacts do not need to be formed on the N-type diffusion layer DN13.

FIG. 4 is a schematic view showing the disposition of a cell array where the SRAM cells 100 formed using the layout shown in FIG. 2 are apposed. Meanwhile, in FIG. 4, X indicates a unit SRAM cell (SRAM cell 100). In the semiconductor memory device according to this embodiment, a well potential supply region is provided in each of the unit SRAM cells 100. For this reason, dedicated well potential supply cells Y (see FIG. 7) used to supply well potentials do not need to be formed.

As described above, in the semiconductor memory device according to the exemplary embodiment, the well potential supply region used to supply a well potential is provided in the unit SRAM cell 100. That is, according to the exemplary embodiment, the first and second P-type well potential supply regions, which are used to supply first and second P well potentials to the first and second P-well regions, respectively, are formed in the first and second P-well regions. Further, the N-type well potential supply region, which is used to supply an N well potential to the N-well region, is formed in the N-well region. In this way, a well potential supply region is provided in each of the unit SRAM cells. For this reason, dedicated well potential supply cells used to supply well potentials do not need to be formed. Accordingly, in the semiconductor memory device according to this embodiment, it is possible to uniformly and regularly arrange memory cells in the memory cell formation region.

Further, in the exemplary embodiment, dedicated well potential supply cells do not need to be provided at regular intervals. Therefore, in the semiconductor memory device according to the exemplary embodiment, it is possible to improve area efficiency of the SRAM cell array.

Furthermore, since the well potential supply cells need to be provided at regular intervals in the semiconductor memory device in the related art, supplied well potentials are lowered in the SRAM cells spaced apart from the well potential supply cells. For this reason, it is highly likely that latch-up will occur in the semiconductor memory device in the related art. Meanwhile, since the well potential supply regions are provided in the unit SRAM cells in the semiconductor memory device according to the exemplary embodiment, it is possible to supply a stable well potential to each of the unit SRAM cells. Therefore, it is possible to suppress the occurrence of latch-up in the semiconductor memory device according to the exemplary embodiment.

Further, the first and second P-type well potential supply regions and the N-type well potential supply region are formed outside the SRAM cell 100. Therefore, in the semiconductor memory device according to the exemplary embodiment, it is possible to share the P-type well potential supply region and the N-type well potential supply region by the unit SRAM memory cell 100 and the unit memory cell adjacent to the unit SRAM memory cell 100.

Furthermore, in the semiconductor device according to the exemplary embodiment, at least two contacts CT are formed in the N-type diffusion layer adjacent to the P-type diffusion layer that forms first and second P well potential supply regions, and at least two contacts CT are formed in the P-type diffusion layer adjacent to the N-type diffusion layer that forms the N well potential supply region. For example, a total of at least two contacts CT are formed in the N-type diffusion layers DN4 and DN9 adjacent to the P-type diffusion layer DP5 that forms the first P well potential supply region. Since plural contacts is formed in the diffusion layer adjacent to the butting diffusion layer in this way, it is possible to decrease the resistance between the power source potential and the diffusion region or between the ground potential and the diffusion region.

Since the plural contacts are formed as described above, it is possible to decrease the resistance between the power source potential and the diffusion region or between the ground potential and the diffusion region. Therefore, contacts CT are formed on the P-type diffusion layer DP5 that forms the first P well potential supply region of the exemplary embodiment shown in FIG. 2. Meanwhile, even when contacts CT are not formed on the P-type diffusion layer DP5, current flows between the power source potential and the diffusion region or between the ground potential and the diffusion region. For this reason, the contacts CT do not necessarily need to be formed on the P-type diffusion layer DP5.

The exemplary embodiment of the invention has been described in detail above, but may includes various modifications without departing from the scope of the invention.

Further, it is noted that Applicant's intent is to encompass equivalents of all claim elements, even if amended later during prosecution.

What is claimed is:

1. A semiconductor memory device comprising:
   a first well region of a first conductivity type;
   at least first and second SRAM cells adjacently arranged to each other, said first and second SRAM cells each including a first transfer transistor and a drive transistor formed on said first well region, said first transfer transistor and said drive transistor being coupled in series between a bit line and a power source line;
   a first diffusion region of said first conductivity type arranged between said drive transistor of said first SRAM cell and said drive transistor of said second SRAM cell to apply a first well potential to said first well region;
   wherein said first transfer transistor and said drive transistor of said first SRAM cell, said first transfer transistor and said drive transistor of said second SRAM cell, and said first diffusion region are arranged on a straight line;
   a second well region of a second conductivity type; and
   a second diffusion region of said second conductivity type to apply a second well potential to said second well region, wherein:
   said first SRAM cell includes a first load transistor formed on said second well region;
   said second SRAM cell includes a second load transistor formed on said second well region; and
   said second diffusion region is arranged between said first and second load transistors;
   a third well region of said first conductivity type arranged so that said second well region is placed between said first and third well regions;
   a third diffusion region of said first conductivity type to apply said first well potential to said third well region;
   a fourth diffusion region of said first conductivity type to apply said first well potential to said third well region, wherein:
   said first and second SRAM cells each further includes at least a second transfer transistor and a second drive transistor formed on said third well region, said second transfer transistor and said second drive transistor being coupled in series between a second bit line and said power source line; and
   said second transfer transistors and said second drive transistors of said first and second SRAM cells are arranged between said third and fourth diffusion regions.

2. The semiconductor memory device as claimed in claim 1, wherein:
   said line comprises a first line;
   said third and fourth diffusion regions, said second transfer transistors and said second drive transistors of said first and second SRAM cells are arranged on a second line parallel with said first line.

3. A semiconductor memory device comprising:
   a first well region of a first conductivity type;
   at least first and second SRAM cells adjacently arranged to each other, said first and second SRAM cells each including a first transfer transistor and a drive transistor formed on said first well region, said first transfer transistor and said drive transistor being coupled in series between a bit line and a power source line;

a first diffusion region of said first conductivity type arranged between said drive transistor of said first SRAM cell and said drive transistor of said second SRAM cell to apply a first well potential to said first well region;

a first contact provided to apply a power source to said first drive transistor of said first SRAM cell on said first well region;

a second contact provided to apply said power source to said first drive transistor of said second SRAM cell on said first well region; and a diffusion layer of a second conductivity type provided between said first and second contacts so that said diffusion layer has a dent portion where said first diffusion region is provided to embed in said dent portion.

* * * * *